United States Patent
Gaucher et al.

[11] Patent Number: 5,143,636
[45] Date of Patent: Sep. 1, 1992

[54] CONTROLLED-POROSITY PIEZOELECTRIC CERAMIC

[75] Inventors: Philippe Gaucher, Gif sur Yvette; Jean-Pierre Ganne, Orsay; Jean-Claude Dubois, St Remy les Chevreuses, all of France

[73] Assignee: Thomson-CSF, Puteaux, France

[21] Appl. No.: 728,617

[22] Filed: Jul. 11, 1991

[30] Foreign Application Priority Data

Aug. 7, 1990 [FR] France .................. 90 10065

[51] Int. Cl.$^5$ .................................... C04B 35/46
[52] U.S. Cl. .................................. 252/62.9; 501/12; 501/74; 501/137; 252/315.7
[58] Field of Search .................. 501/12, 84, 134, 137, 501/85; 252/62.9, 315.2, 315.7; 264/43, 53

[56] References Cited

U.S. PATENT DOCUMENTS 3,892,580 7/1975 Messing ..................... 501/153
4,402,927 9/1983 von Dardel et al. ........... 423/335
4,784,794 11/1988 Kato .......................... 252/313.1

FOREIGN PATENT DOCUMENTS 2223324 10/1974 France .
WO88/08360 11/1988 PCT Int'l Appl. .
1313091 4/1973 United Kingdom .

OTHER PUBLICATIONS

Chemical Abstracts, vol. 109, Oct. 1988, p. 839, "Study and Preparation of Ceramic Particles as Piezoelectric Precursors of Modified Lead Titanate".
Chemical Abstracts, vol. 109, No. 26, Dec. 1988, p. 305, "Method for Manufacturing Molded Ceramic Precursors", Nippon Steel Corp., Columbus, Ohio U.S.

Primary Examiner—Karl Group
Assistant Examiner—Chris Gallo
Attorney, Agent, or Firm—Marmorek, Guttman & Rubenstein

[57] ABSTRACT

The invention is a process to manufacture a controlled-porosity ceramic material by synthesizing an aerogel produced by hypercritical drying of a high-porosity gel. Applications in the submarine acoustic field (active and passive sonars).

5 Claims, 3 Drawing Sheets

CONTROLLED-POROSITY PIEZOELECTRIC CERAMIC

BACKGROUND OF THE INVENTION

This invention is a method of producing a controlled-porosity piezoelectric ceramic whose properties offer advantages in submarine acoustics (active and passive sonars), medical applications (ultrasonic imagery) and signal processing (filters, delay lines, etc.).

In general terms, when polarized by a voltage applied prior to their use, ferroelectric materials offer high piezoelectric charge coefficients resulting from the creation of an electrical charge when they are subjected to pressure.

DESCRIPTION OF THE PRIOR ART

These ferroelectric materials can be ceramics, such as barium titanate or lead zirconium-titanate (PZT) or polymer material such as poly vinylidene fluoride (PVDF).

The various physical characteristics used to indicate the performance of these materials in the applications mentioned above are:

the hydrostatic charge coefficient $d_h$ defined as the combination of coefficients $d_{33}$ and $d_{31}$ which represent the efficiency of the transverse and longitudinal modes respectively: $d_h = d_{33} - 2d_{31}$.

the coupling coefficient $K_h$ which represents the efficiency with which the piezoelectric material converts an electrical signal to ultrasound and vice-versa:

$$k_h = d_h^2 / \epsilon . S$$

where $\epsilon$ is the dielectric constant

S is the elastic compliance the tension coefficient $g_h$ (in the passive operating mode, i.e. detecting sound waves):

$$g_h = dE/dP = d_h/\epsilon$$

where E is the electrical field induced by pressure P.

Ceramic materials which have low compliance because they are very rigid offer better coupling coefficients $K_h$ than polymers such as PVDF. Nonetheless, their very high dielectric constant (approx 1700 for PZT) and their high density makes it difficult to adapt their acoustic impedance to that of water and reduce the factor of merit $g_h$.

Work has therefore been done to improve the performance of ceramic materials, particularly to reduce the dielectric constant and increase the $d_h$, $k_h$ and $g_h$ factors. Ceramics such as PZT are very dense materials which can be lightened by producing composite two-phase materials in which phase 1 is a ceramic and phase 2 a resin or air. There are various possible structures in which phases 1 and 2 are connected differently FIG. 1). If a phase 1 powder (non-interconnected grains) is dispersed in an elastic phase 2 material, interconnected in all three directions, the material is designated a 0-3 composite.

The permittivity in this type of structure is reduced but to the detriment of factor $K_h$, since compliance S is increased.

A (1, 3) connectivity, obtained by placing PZT bars perpendicular to the electrodes, allows better transfer of stresses and polarization into the ceramic than can be obtained with (0, 3) connectivity.

Complete connection to the ceramic improves performance even further. This can be achieved using the "lost wax" (investment casting) method and an extremely porous material: coral.

With this process, the PZT material is interconnected in all three directions in space and the interstices are filled with resin. Approximately 50% of the volume is ceramic. The following table summarizes the performance offered by these different types of composite materials.

|  | Pure PZT | (0,3)PZT chloroprene combination | (1,3)PZT-epozy combination | (3,3)coral replica combination |
|---|---|---|---|---|
| $\epsilon_{33}$ | 1700 | 31 | 500 | 400 |
| $d_h$ ($10^{-12}$ C/N) | 50 | 34 | 20 | 100 |
| $g_h$ ($10^{-3}$ V·m/N) | 3 | 1080 | 40 | 250 |
| $d_n \cdot g_h$ ($10^{-15}$ m/N) | 150 | 36 | 800 | 25000 |

The factor of merit $d_h \cdot g_h$ is the predominant characteristic in selecting a piezoelectric material since it represents the overall transmission and reception performance (high transmission efficiency, high reception sensitivity).

Despite the advantages of coral replica PZT, it is a fragile material difficult to use and whose porous structure is unchangeable; however, a model such as the Banno model [Jpn.J of Applied Phys. 24 (1985), suppl. 24-2, 445-7] shows the effect of the pore shape on the various factors ($d_{31}$, $d_{33}$). FIGS. 2 to 5 show the variations in these factors depending on the porosity and pore shape.

This model shows that it would be advantageous to produce highly porous ceramics with elongated pores.

This invention is, therefore, a process to manufacture a piezoelectric ceramic whose porosity can be controlled and can be very high, unlike the process used to synthesize porous ceramics by burning binders while sintering the powder, which only allows porosities of roughly 15% to be obtained. The process complying with this invention includes the following steps:

synthesis of a high-porosity gel in the presence of solvent and gel orientation agents synthesis of the aerogel by drying under conditions in which the solvent pressure and temperature are kept hypercritical to maintain the size and shape of pores obtained in the gel production of the ceramic by calcining the aerogel to form the required structure at high temperature.

This invention is also a piezoelectronic ceramic manufactured using the process as per the invention. This porous ceramic is preferably barium titanate or lead zirconium titanate. The molecules used to orientate the gelling are preferably acetyl-acetone (acac) or acetic acid molecules.

This invention will be better understood, and other advantages will become clear, upon reading the following description of the appended figures including:

DETAILED DESCRIPTION OF THE INVENTION

Figure 1:
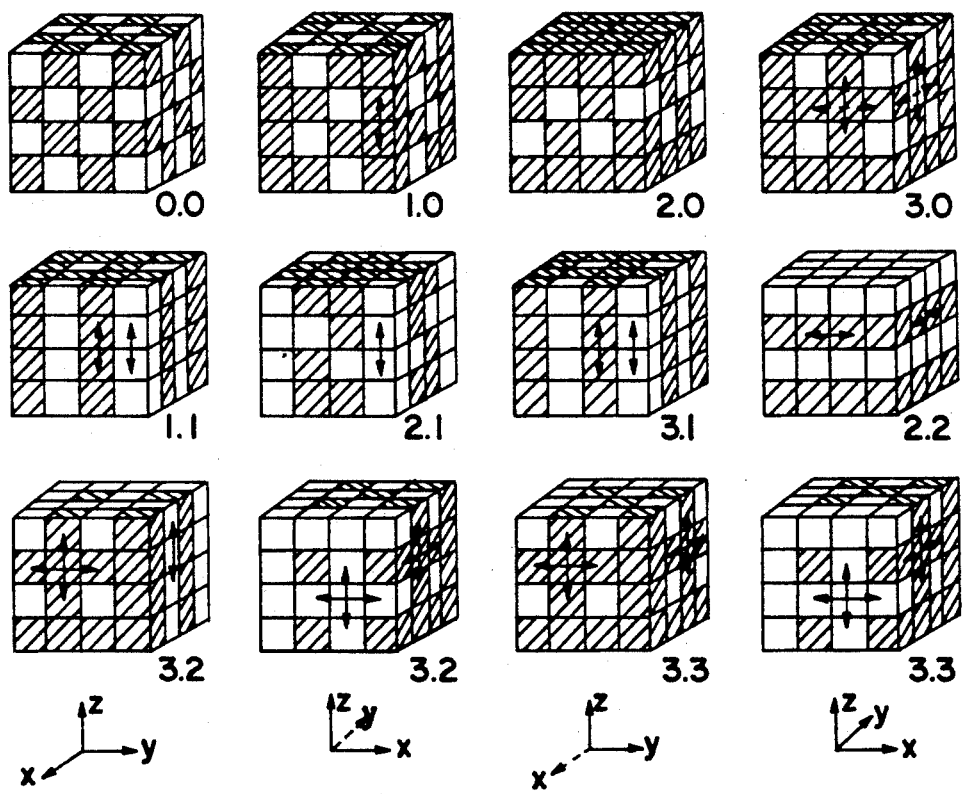
FIG. 1, showing the structure of composite materials with variable connectivity.
Figure 2:
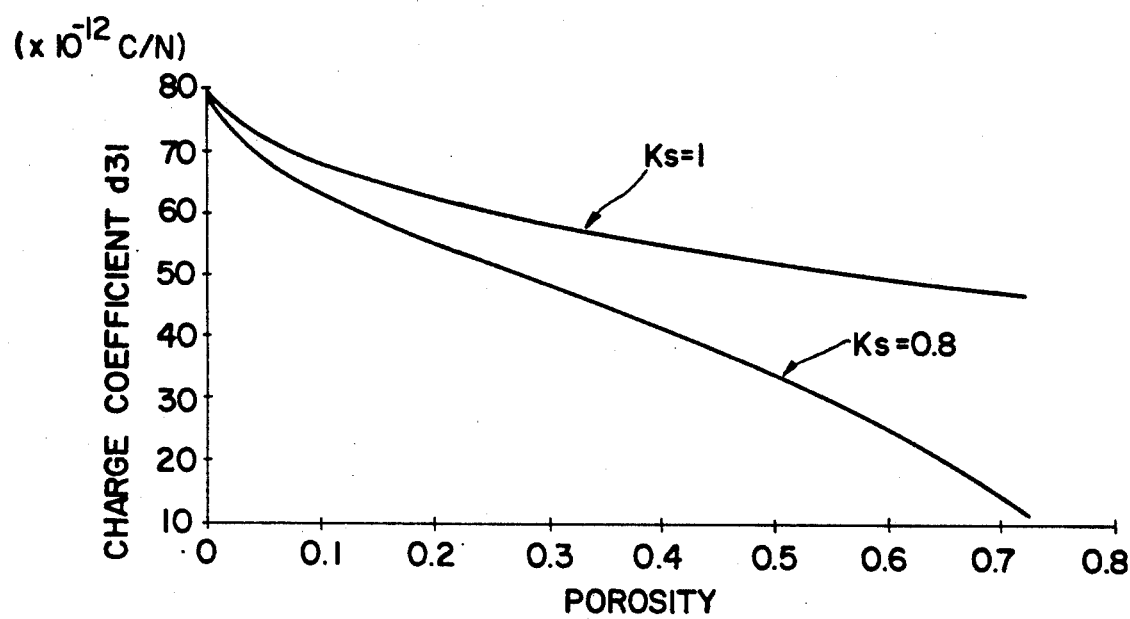
FIG. 2, showing variations in the charge coefficient with porosity, determined by the Banno model ($K_S=1$ with cubic pores, $k_S=0.8$ with rectangular pores)
Figure 3:
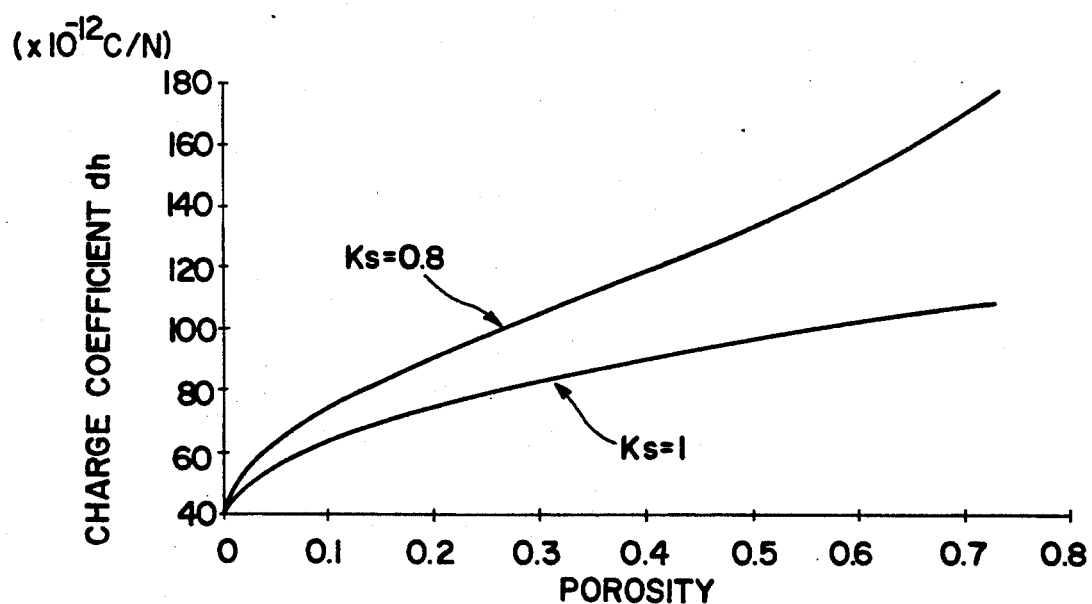
FIG. 3, showing variations in coefficint $d_h$ with porosity, determined by the Banno model.
Figure 4:
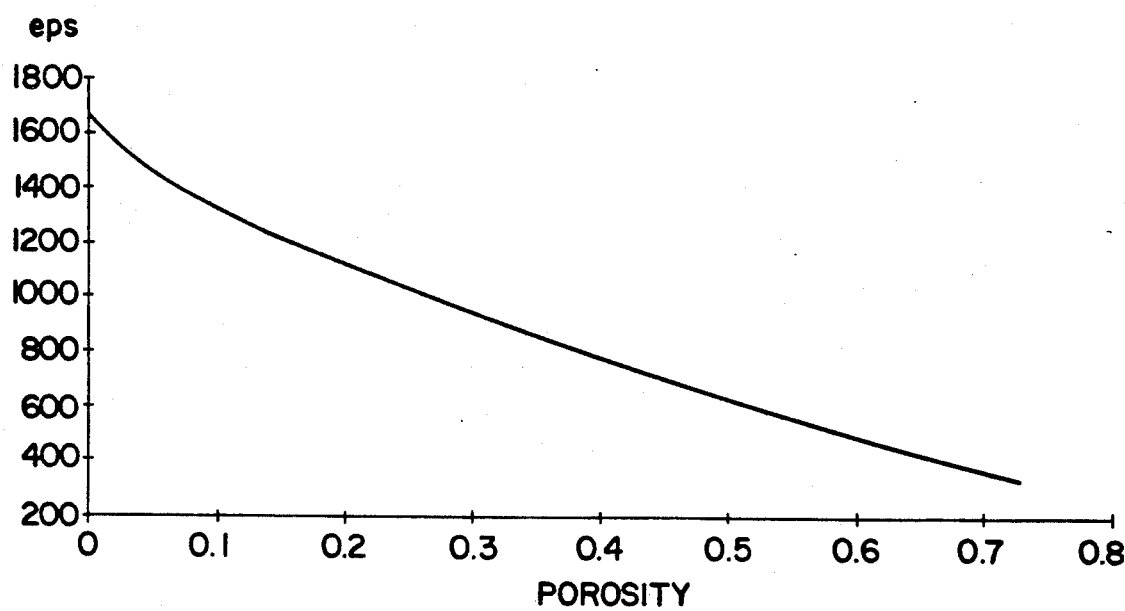
FIG. 4, showing variations in the permittivity with porosity, determined by the Banno model.
Figure 5:
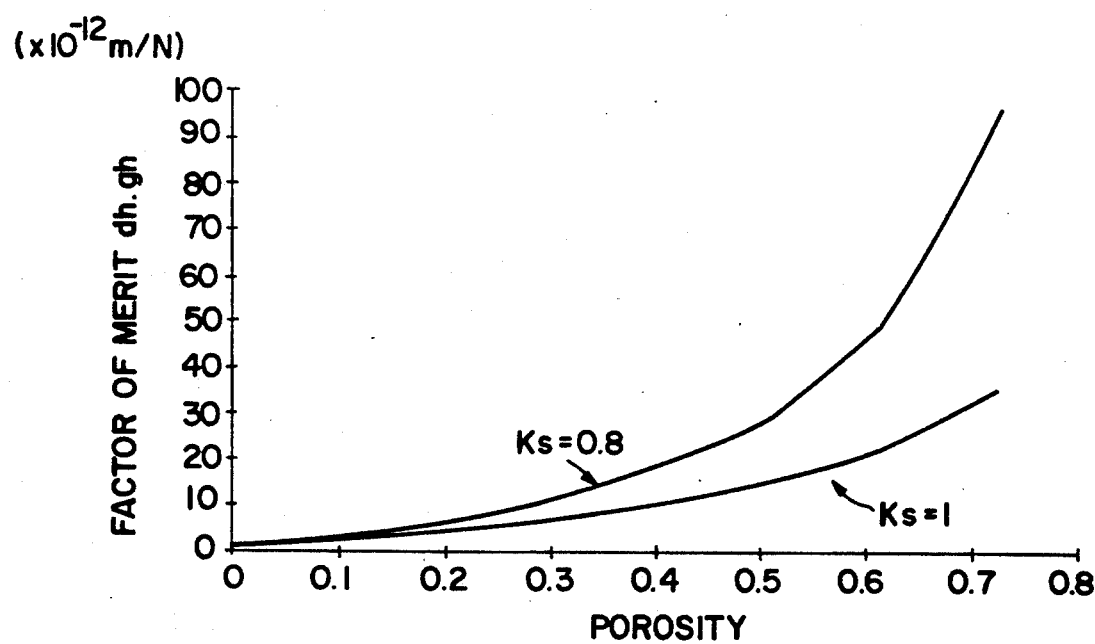
FIG. 5, showing variations in the factor of merit $d_h \cdot g_h$ with porosity, determined by the Banno model.

It is known that the structure of gels produced from organic alcooxides is highly porous. However, these gels shrink considerably during drying at atmospheric pressure, considerably reducing the porosity. To avoid this shrinkage, this invention proposes to dry the gel under hypercritical temperature and pressure conditions where the liquid-vapour equilibrium no longer exists. The fluid to be eliminated passes, by adiabatic expansion, from the pores to the free space above the gel without changing phase and, therefore, without expanding, eliminating the stresses caused by pressures inside the gel. The porosity of the aerogels obtained can be up to 90%. By calcining this aerogel at a moderate temperature, a porous ceramic is obtained whose porosity can be controlled and can be up to 70%. The porosity is controlled during synthesis of the gel by including chelating molecules which block certain precursor functions and thus orientate the gel structure by preventing the formation of certain bonds.

The synthesis of highly-porous PZT is described as an example:

A PZT gel is synthesized by mixing lead, in the form of a carboxylate (acetate, 2-ethyl-hexanoate, etc.), titanium and zirconium in the form of alcooxides (iso or n.propoxide or butoxide) in an alcohol such as propanol 1. After reaction in a reflux, the complex alcooxide is hydrolyzed with between approximately 1 and 10 moles of water per mole of lead by adding a water-propanol mixture. The gel obtained is placed in an autoclave with a pressure relief valve. The temperature is increased to more than 263.5° C. (the critical temperature of propanol) so that the pressure exceeds 51 atmospheres (the critical pressure); the volume is selected to satisfy this condition complying with the Van der Waals isothermal law. The pressure is then relieved in a larger volume but still remaining hypercritical and, on cooling, the 70% porous aerogel and the solvent are recovered separately.

The aerogel is then calcined in an oven to crystallize the PZT phase without increasing its density, that is maintaining the same porosity, at a temperature between 300° and 500° C.

What is claimed is:

1. A process to manufacture a controlled porosity piezoelectric ceramic, the process consisting of the following steps:

synthesis of a gel in the presence of a solvent, synthesis, using an autoclave, of an aerogel by drying the gel at pressure and temperature conditions which are hypercritical for the solvent, production of the ceramic by calcining the aerogel.

2. A process to manufacture a piezoelectric ceramic as described in claim 1, in which the shape of the pores in the gel is controlled by using chelating molecules to orientate gelling.

3. A process to manufacture a piezoelectric ceramic as described in claim 2 in which the chelating molecules are acetyl-acetone or acetic acid molecules.

4. A process to manufacture a piezoelectric ceramic as described in any of claims 1 to 3 in which the gel is synthesized by mixing lead in the form of carboxylate and titanium and zirconium in the form of alcooxides in an alcohol.

5. A process of manufacturing a piezoelectric ceramic as described in any of claims 1 to 3 in which the gel is produced by mixing barium in the form of a carboxylate and titanium in the form of an alcooxide in an alcohol.

* * * * *